US007015088B2

(12) United States Patent
Colombo et al.

(10) Patent No.: US 7,015,088 B2
(45) Date of Patent: Mar. 21, 2006

(54) HIGH-K GATE DIELECTRIC DEFECT GETTERING USING DOPANTS

(75) Inventors: Luigi Colombo, Dallas, TX (US); James J. Chambers, Dallas, TX (US); Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/335,560

(22) Filed: Dec. 31, 2002

(65) Prior Publication Data

US 2004/0127000 A1 Jul. 1, 2004

(51) Int. Cl.
*H01L 21/00* (2006.01)
*H01L 21/8242* (2006.01)
(52) U.S. Cl. .......................... 438/240; 438/3
(58) Field of Classification Search .............. 438/3, 438/240
See application file for complete search history.

(56) References Cited

U.S. PATENT DOCUMENTS

| | | | |
|---|---|---|---|
| 6,051,865 A * | 4/2000 | Gardner et al. ............. 257/411 |
| 6,117,739 A | 9/2000 | Gardner et al. | |
| 6,303,520 B1 | 10/2001 | Kwong et al. | |
| 6,320,238 B1 | 11/2001 | Kizilyalli et al. | |
| 6,369,430 B1 | 4/2002 | Adetutu et al. | |
| 6,800,889 B1 * | 10/2004 | Takatani et al. ............. 257/295 |
| 2002/0081862 A1 | 6/2002 | Rotondaro | |
| 2002/0106536 A1 | 8/2002 | Lee et al. | |

OTHER PUBLICATIONS

"Intermixing at the tantalum oxide/silicon interface in gate dielectric structures", G.B. Alders, D.J. Werder, Y. Chabal, H.C. Lu, E,P. Gusev, E. Garfundel, T. Gustafsson and R.S. Urdahl; 1998 American Institute of Physics, Applied Physics Letters vol. 73, No. 11, Sep. 14, 1998, pp. 1517-1519.
"Silicon Oxynitride Films as a Segue to the High-K Era", A. Karamcheti, V.H.C. Watt, H.N. Al-Shareef, T.Y. Luo, G.A. Brown, M.D. Jackson and H.R. Huff; Semiconductor Fabtech—12th Edition, no date available, pp. 207-214.

* cited by examiner

*Primary Examiner*—Chuong Anh Luu
(74) *Attorney, Agent, or Firm*—Jacqueline J. Garner; W. James Brady, III; Frederick J. Telecky, Jr.

(57) ABSTRACT

One or more aspects of the present invention relate to forming a transistor while passivating electrically active defects associated with a top portion of a layer of high-k dielectric material. The layer of high-k dielectric material is utilized to establish a high-k gate dielectric in the transistor. A gate electrode layer is formed over the layer of high-k dielectric material, and is patterned to form a gate structure that includes a gate electrode and the high-k gate dielectric. The electrically active defects are passivated utilizing materials containing dopants that are attracted to and neutralize the defects. The passivated defects thus do not interfere with other transistor doping processes (e.g., forming source and drain regions) and do not adversely affect resulting semiconductor device performance, reliability and yield.

15 Claims, 13 Drawing Sheets

HIGH-K GATE DIELECTRIC DEFECT GETTERING USING DOPANTS

FIELD OF INVENTION

The present invention relates generally to semiconductor processing, and more particularly utilizing dopants to getter electrically active defects in high-k gate dielectric materials.

BACKGROUND OF THE INVENTION

In the semiconductor industry, there is a continuing trend toward manufacturing integrated circuits (ICs) with a greater number of layers and with higher device densities. To achieve these high densities there have been, and continues to be, efforts towards reducing the thickness of layers, improving the uniformity of layers, reducing the thickness of devices and scaling down device dimensions (e.g., at sub micron levels) on semiconductor wafers. In order to accomplish such higher device packing densities, thinner layers, more uniform layers, smaller feature sizes, and smaller separations between features are required. This can include the thickness of gate oxide materials (e.g., $SiO_2$), the width and spacing of interconnecting lines, the spacing and diameter of contact holes, and the surface geometry such as corners and edges of various features. The scaling-down of integrated circuit dimensions can facilitate faster circuit performance, and can lead to higher effective yield in IC fabrication by providing more circuits on a die and/or more die per semiconductor wafer. Such advantages are a driving force to constantly scale down IC dimensions.

The process of manufacturing integrated circuits typically consists of more than a hundred steps, during which hundreds of copies of an integrated circuit can be formed on a single wafer. Generally, the process involves creating several layers on and in a substrate that ultimately forms the complete integrated circuit. This layering process can create electrically active regions in and on the semiconductor wafer surface. In metal-oxide-semiconductor (MOS) transistors, for example, a gate structure is created, which can be energized to establish an electric field within a semiconductor channel, by which current is enabled to flow between a source region and a drain region within the transistor. The source and drain regions facilitate this conductance by virtue of containing a majority of p or n type materials. The regions are typically formed by adding dopants to targeted areas on either side of the channel region in a semiconductor substrate. The gate structure includes a gate dielectric and a contact or gate electrode. The gate contact generally includes metal or doped polysilicon and is formed over the gate dielectric, which is itself formed over the channel region. The gate dielectric is an insulator material, which prevents large currents from flowing from the gate electrode into the channel when a voltage is applied to the gate contact, while allowing an applied gate voltage to set up an electric field within the channel region in a controllable manner.

Transistors are physically very small in many cases, whereby many such devices may be formed on a single-crystal silicon substrate (which can include a base semiconductor wafer and any epitaxial layers or other type semiconductor layers formed thereover or associated therewith) and interconnected in an integrated circuit. Nevertheless, the size of the transistors and other electrical components is continually decreasing to improve device density. However, certain properties of the materials utilized to form the transistors limit the size to which the transistors can be reduced. By way of example, properties of silicon dioxide ($SiO_2$), which is commonly used to form the layer comprising the gate dielectric in transistors, can limit the degree to which the thickness of the gate dielectric can be reduced. For instance, extremely thin $SiO_2$ layers allow for significant gate leakage currents due to direct tunneling of charge carriers through the oxide. Thus, it has been found that operating parameters may change dramatically due to slight variations in gate dielectric thickness.

Furthermore, thin gate dielectric layers are known to provide poor diffusion barriers to impurities. Thus, for example, extremely thin $SiO_2$ gate dielectric layers suffer from high boron penetration into the underlying channel region during doping of the source/drain regions. Consequently, recent efforts at device scaling have focused on alternative dielectric materials that can be formed in a thicker layer than silicon dioxide layers and yet still produce the same field effect performance. These materials are often referred to as high-k materials because their dielectric constants are greater than that of $SiO_2$. The relative performance of such high-k materials is often expressed as equivalent oxide thickness (EOT) because the alternative material layer may be thicker, while providing the equivalent electrical effect of a much thinner layer of $SiO_2$. Accordingly, high-k dielectric materials can be utilized to form gate dielectrics, and the high-k materials facilitate a reduction in device dimensions while maintaining a consistency of desired device performance.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its purpose is merely to present one or more concepts of the invention in a simplified form as a prelude to the more detailed description that is presented later.

According to one aspect of the present invention, a methodology for forming a transistor includes passivating electrically active defects associated with a top surface of a high-k dielectric layer, which is utilized to form a gate dielectric within the transistor. The electrically active defects are passivated utilizing readily available materials such that the processing does not require significant additional steps, masks, etc. and is thus cost effective and efficient. The materials contain dopants that, when applied to the high-k dielectric layer, neutralize the defects. Left untreated, the defects can persist at the interface of a gate electrode and the high-k gate dielectric, and can degrade the performance, reliability and yield of resulting semiconductor devices.

In accordance with another aspect of the present invention, a methodology of forming a transistor includes forming a high-k dielectric layer over a semiconductor substrate and passivating electrically active defects associated with a top surface of the high-k dielectric layer. A gate electrode layer is then formed over the high-k dielectric layer and is patterned to form a gate electrode structure. Source and drain regions are then formed in the semiconductor substrate on opposite sides of the gate electrode structure. A channel region is defined in the substrate as the source and drain regions are formed therein.

In accordance with yet another aspect of the present invention, a methodology of fabricating a PMOS device includes heating a solid material having an n-type dopant associated therewith to about 250 to 1000 degrees C. for about 1 second to 1 hour. The solid material is formed over a layer of high-k dielectric material and at least some of the n-type dopant is driven by the heating from the solid material into at least some of the high-k dielectric material to neutralize at least some electrically active defects within the high-k dielectric material. The solid material is then removed to expose the high-k dielectric material, and a gate electrode layer is formed over the high-k dielectric material. The gate electrode layer is then patterned and doped with a p-type dopant. Source and drain regions are also established with the p-type dopant.

According to still another aspect of the present invention, a methodology of fabricating an NMOS device includes heating a solid material having a p-type dopant associated therewith to about 250 to 1000 degrees C. for about 1 second to 1 hour. The solid material is formed over a layer of high-k dielectric material and at least some of the p-type dopant is driven by the heating from the solid material into at least some of the high-k dielectric material to neutralize at least some electrically active defects within the high-k dielectric material. The solid material is then removed to expose the high-k dielectric material, and a gate electrode layer is formed over the high-k dielectric material. The gate electrode layer is then patterned and doped with an n-type dopant. Doping with the n-type dopant also establishes source and drain regions within the transistor.

In accordance with yet another aspect of the present invention, a methodology of passivating electrically active defects at an interface of a high-k dielectric material and a polysilicon gate electrode in a MOS transistor includes implanting the polysilicon gate electrode with a p-type or an n-type dopant, and annealing the transistor such that at least some of the dopant is attracted to at least some of the electrically active defects.

According to still another aspect of the present invention, a method of forming a transistor includes forming a high-k dielectric layer over a semiconductor substrate and passivating electrically active defects associated with a top surface thereof. The passivation comprises subjecting the top surface of the high-k dielectric to dopants in a gaseous phase. A gate layer is then formed over the high-k dielectric and patterned to form a gate electrode. The substrate is then subjected to implantation to form the source/drain regions and dope the gate electrode.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
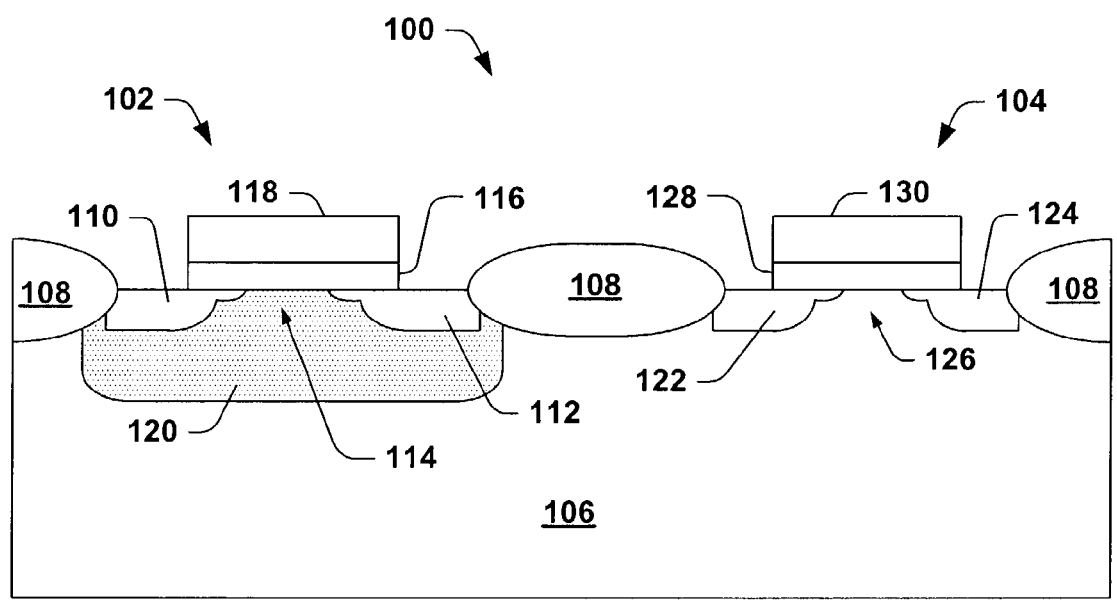
FIG. 1 is a simplified, schematic view of a conventional semiconductor device containing both PMOS and NMOS transistor devices.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

One or more aspects of the present invention relate to forming a transistor while passivating electrically active defects in a layer of high-k dielectric material, and more particularly within a top portion of the layer of high-k dielectric material. The high-k dielectric material is utilized to establish a high-k gate dielectric in the transistor, and has a gate electrode formed thereover in the resulting transistor. The presence of electrically active defects in the top portion of the high-k dielectric can interfere with a transistor doping process (e.g., concurrent doping of the gate electrode when source and drain regions are formed) and can adversely affect resulting semiconductor device performance, reliability and yield.

FIG. 1 illustrates a conventional semiconductor device 100 containing both PMOS and NMOS transistor devices 102 and 104, respectively. The device 100 is fabricated with conventional complimentary MOS (CMOS) processing techniques in a semiconductor substrate 106, in which isolation structures (e.g., $SiO_2$ field oxide (FOX) or shallow trench isolation (STI) structures) 108 are formed to separate and provide electrical isolation of the individual devices 102 and 104 from other devices and from one another. It is to be appreciated that the term "semiconductor substrate" as used herein can include a base semiconductor wafer and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that the actual dimensions of the elements may differ substantially from that shown herein.

The PMOS device 102 includes two laterally spaced p-doped source/drain regions 110 and 112 with a channel region 114 located therebetween. A gate dielectric 116 is formed over the channel region 114, and comprises an insulative material, such as silicon dioxide ($SiO_2$), for example. A contact structure 118 or gate electrode is formed over the gate dielectric layer 116, and contains a polysilicon material, for example. Additionally, an n-well 120 is formed within the substrate 106 (which is typically a lightly doped p material).

The NMOS device 104 includes two laterally spaced n-doped source/drain regions 122 and 124 with a channel region 126 located therebetween. As with the PMOS device 102, a gate dielectric 128 is formed over the channel region 126, and comprises an insulative material, such as silicon dioxide ($SiO_2$), for example. A contact structure 130 or gate electrode is formed over the gate dielectric layer 128, and generally contains polysilicon material.

In operation in both of the devices, but with reference to the PMOS device 102 for purposes of simplicity and ease of understanding, the resistivity of the channel 114 may be controlled by a voltage applied to the gate electrode 118, where changing the gate voltage changes an amount of current flowing through the channel 114. The gate contact or electrode 118 and the channel 114 are separated by the gate dielectric 116, which is an insulator and which opposes current flow between the gate electrode 118 and the channel 114.

As the thickness of the gate dielectric 116 is scaled down to increase device density and enhance processing speed, however, "tunneling" current may be observed through the dielectric. If the dielectric 116 is scaled down to tens of angstroms, for example, charge carriers may be able to tunnel through the gate dielectric 116 and into the channel 114. Basically, the thinner the dielectric, the larger the tunneling current. When charge carriers tunnel through the gate dielectric 116, gate leakage current undesirably increases, resulting in increased static power dissipation and potentially degraded circuit operation. In addition, with charge carriers tunneling through the gate dielectric 116, decreased charge carrier accumulation in the channel 114 of the transistor 102 may result in an undesirable increase in channel resistance. Furthermore, with the thin gate dielectric 116, charge accumulation at the gate electrode 118 causes an undesirable increase in charge carrier scattering at the surface of the channel of the device. Such an increase in charge carrier scattering in turn results in higher resistance through the channel 114 of the transistor 102 and reduced carrier mobility.

In light of these disadvantages, high-k dielectric materials (e.g., having a dielectric constant higher than that of silicon dioxide ($SiO_2$)) can be utilized in forming gate dielectrics in MOS transistors. When a gate dielectric is comprised of a high-k dielectric material, the gate dielectric has a larger thickness than when the gate dielectric is comprised of silicon dioxide ($SiO_2$). For example, a gate insulator with a dielectric constant of twenty (20) can be approximately 50 Angstroms thick and achieve the same equivalent electrical thickness of an $SiO_2$ film approximately 10 Angstroms thick. The larger thickness tends to minimize charge carrier tunneling through the gate dielectric. In particular, charge carrier tunneling through the gate dielectric can be minimized exponentially by the thickness of the gate dielectric.

With high-k gate dielectric materials, however, a region at the interface of the gate dielectric and the gate contact can contain electrically active defects that can compromise, among other things, the reliability and operation of resulting integrated circuits. Thus, passivating or neutralizing such defects can have a positive effect on the yield, reliability and performance of resulting semiconductor devices.

Figure 2:
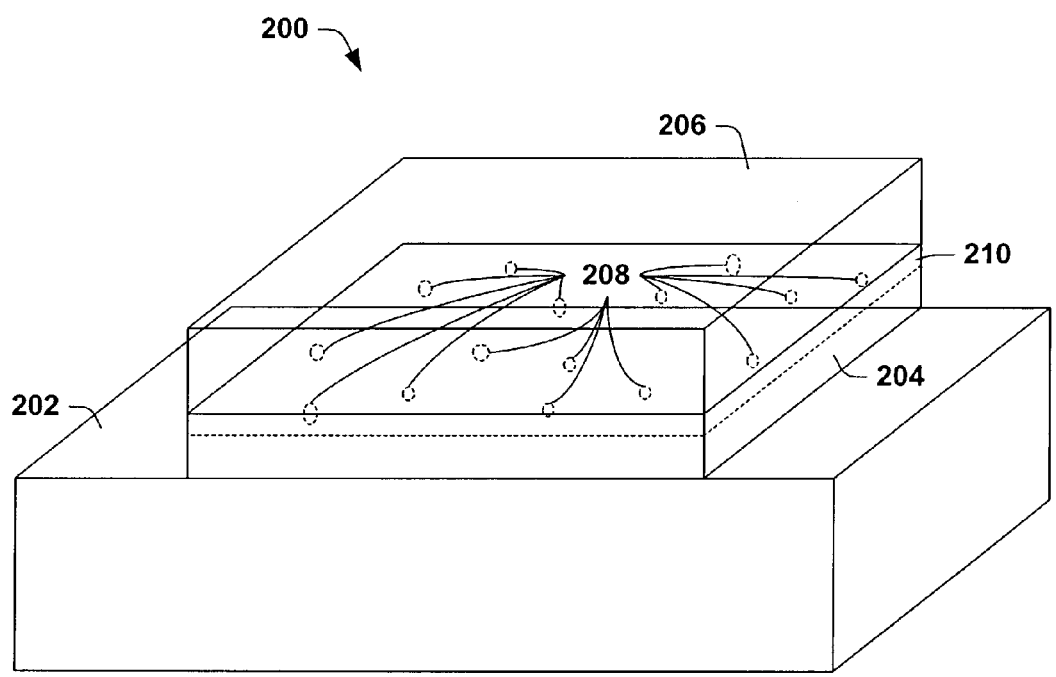
FIG. 2 is a perspective view of a transistor formed upon a substrate with a plurality of electrically active defects at the interface of a gate electrode and a high-k gate dielectric.

Turning to FIG. 2, a perspective view of a transistor 200 is depicted as having a plurality of electrically active defects. The transistor 200 is formed upon a substrate 202 and includes a layer of high-k dielectric material 204 overlying the substrate 202. A layer of generally polysilicon material (or alternatively a polysilicon germanium or metal, etc.) overlies the layer of high-k dielectric material 204 to form a gate electrode 206. The substrate 202 generally includes silicon, but can include any suitable material. The high-k dielectric can be comprised of any of a number of suitable materials that, alone or in combination, have a dielectric constant greater than that of silicon dioxide ($SiO_2$) or about 3.9. Such high-k materials can include, for example, silicon nitride ($SiN_4$), tantalum pentoxide ($Ta_2O_5$), titanium oxide ($TiO_2$), barium strontium titanate (BST), which have dielectric constants of between 7 and 9, between 20 and 26, 30 and >200, respectively, as well as $Al_2O_3$, $ZrO_2$, $HfO_2$, zirconium oxynitride, hafnium oxynitride, zirconium silicate, hafnium silicate, zirconium silicon oxynitride, and hafnium silicon oxynitride. The transistor may also include doped source and drain regions as well as a doped channel (e.g., as illustrated in FIG. 1). These areas are omitted from FIG. 2 merely for purposes of simplicity and ease of understanding.

A plurality of electrically active defects 208 (depicted in phantom) are located at the interface of the high-k dielectric 204 and gate electrode 206. More particularly, the defects 208 are found within a top surface 210 (depicted in phantom) of the high-k dielectric 204. Such defects can number, for example, about $10^{12}$ to $10^{13}$ per square centimeter that may be coincident with about 1% or less of the top surface 210 area of the high-k gate dielectric 204. Such a concentration of defects can be thought of as the absence of an atom at every one hundred atoms, for example. The defects can contribute to leakage currents and give rise to a flat band voltage ($V_{fb}$) or threshold voltage (Vt) shift, which is attributed to charge and/or work function changes resulting from the effects of the defects. The defects can also be thought of as interface traps near the high-k dielectric 204 and gate electrode interface. Interface traps are the apparent result of dangling bonds at the interface. Dangling bonds represent sites where hot carrier injection, Fowler-Nordheim tunneling, Frenkel-Poole leakage and direct tunneling can occur. Although tunneling is thought to arise as a natural consequence of the quantum mechanical nature of electrons positioned near a very thin oxide layer, dangling bonds appear to exacerbate the problem. Independent of the exact physical cause of carrier injection, the empirical result may be gate leakage currents and/or device failure. Neutralizing the defects, or facilitating a reduction in the density of defects, can, consequently, among other things, reduce leakage currents for particular dielectric thicknesses and improve the reliability and performance of resulting devices.

Figure 3:
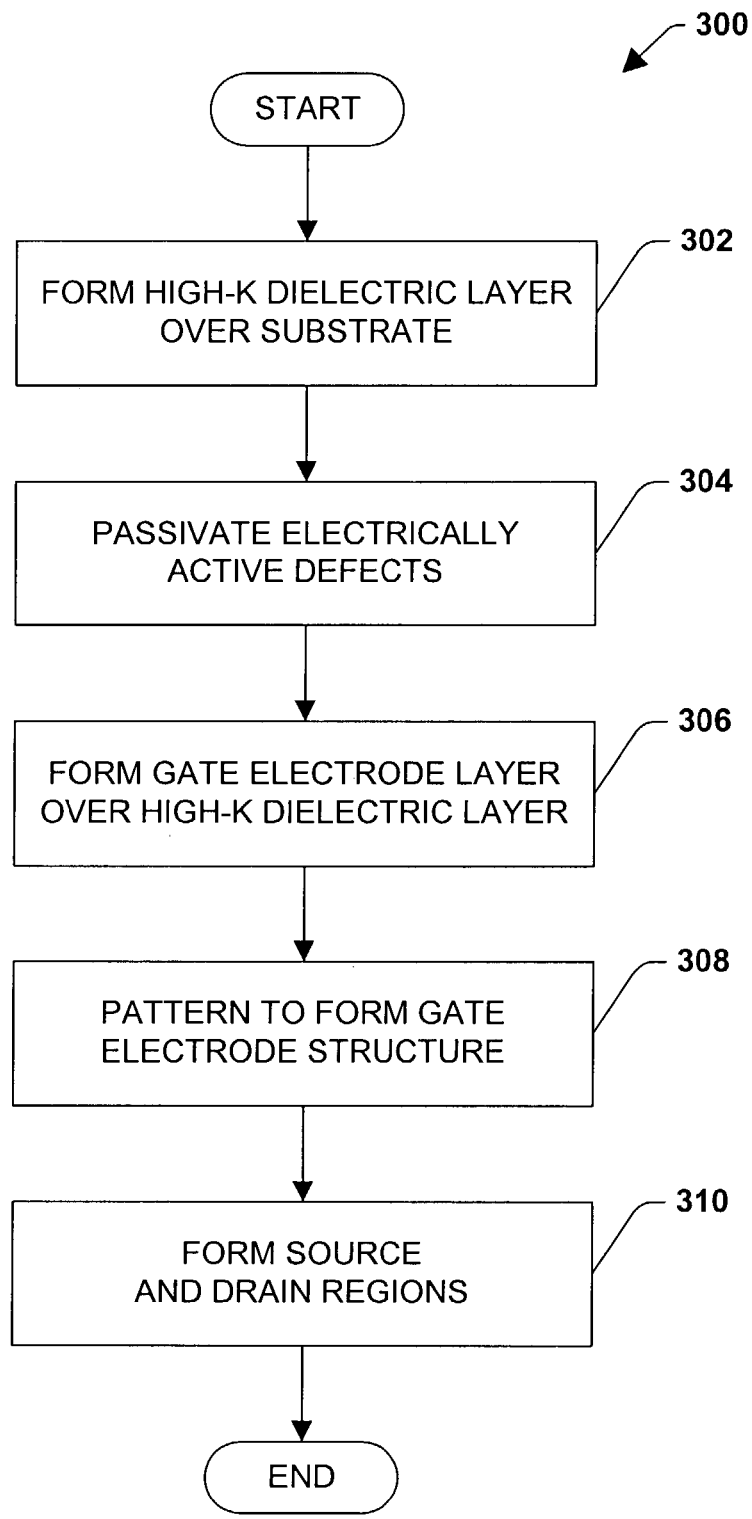
FIG. 3 is a flow diagram illustrating an example of a methodology of fabricating a transistor while passivating electrically active defects in accordance with one or more aspects of the present invention.

With reference to FIG. 3, in accordance with one or more aspects of the present invention, a methodology 300 is illustrated for forming a transistor upon a substrate wherein electrically active defects within a top portion of a high-k dielectric material are neutralized. Although the methodology 300 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated. By way of example, the method or variants thereof may be used according to one or more aspects of the present invention in the fabrication of a transistor as illustrated and described below with respect to FIGS. 4–15.

The methodology begins at 302 wherein a layer of high-k dielectric material is formed over a semiconductor substrate.

The high-k dielectric material can be applied to the substrate in any number of ways, such as with spin-on techniques, sputtering techniques (e.g., magnetron or ion beam sputtering), growth and/or deposition techniques, for example. The substrate generally includes silicon, and the high-k dielectric material generally comprises a material having a dielectric constant higher than about 3.9 (e.g., higher than silicon dioxide ($SiO_2$)). Such high-k materials can include, for example, silicon nitride ($SiN_4$), tantalum pentoxide ($Ta_2O_5$), titanium oxide ($TiO_2$), barium strontium titanate (BST), which have dielectric constants of between 7 and 9, between 20 and 26, 30 and >200, respectively, as well as $Al_2O_3$, $ZrO_2$, $HfO_2$, zirconium oxynitride, hafnium oxynitride, zirconium silicate, hafnium silicate, zirconium silicon oxynitride, hafnium silicon oxynitride or other suitable materials.

The methodology then proceeds to 304 wherein electrically active defects associated with a top surface of the high-k dielectric material are passivated. The top portion of the high-k dielectric material corresponds to a location where the high-k dielectric material interfaces with a gate electrode layer subsequently formed over the high-k dielectric material to establish a gate structure within the transistor. In one aspect of the invention, the electrically active defects are passivated by exposing the defect sites to dopants resulting in a neutralization thereof. After the electrically active defects have been passivated, the methodology advances to 306 where a gate electrode layer is formed over the high-k dielectric layer. As with the high-k dielectric layer, the gate electrode layer can be formed in any of a number of suitable manners, including, for example, with spin-on techniques, sputtering techniques (e.g., magnetron or ion beam sputtering), growth and/or deposition techniques.

The methodology then advances to 308 where the gate electrode layer is patterned to form a gate electrode structure. The gate electrode layer can be patterned in any suitable manner to form the gate electrode structure, such as by etching, for example. It will be appreciated that the high-k dielectric layer can also be patterned to establish the gate structure. After the patterning, the methodology proceeds to 310 where source and drain regions are formed in the semiconductor substrate on opposite sides of the gate electrode structure. The source and drain regions can be formed, for example, by adding a dopant (e.g., n or p type substances) to areas of the substrate opposite the gate electrode structure by ion implantation. By forming the source and drain region, a channel is defined in the substrate in an area located under the gate structure and between the source and drain regions. It is to be appreciated that the gate electrode structure can also be doped when the source and drain regions are formed.

Turning now to FIGS. 4–15, in accordance with one or more aspects of the present invention, an example of a methodology of forming a transistor 400 is provided. The transistor 400 is formed upon a semiconductor substrate 402, while passivating electrically active defects in a top surface of a layer of a high-k dielectric material utilized to form a gate dielectric. The transistor 400 is depicted in FIGS. 4–15 with reference to cross-sectional views of the transistor 400 at various stages of development.

Figure 4:
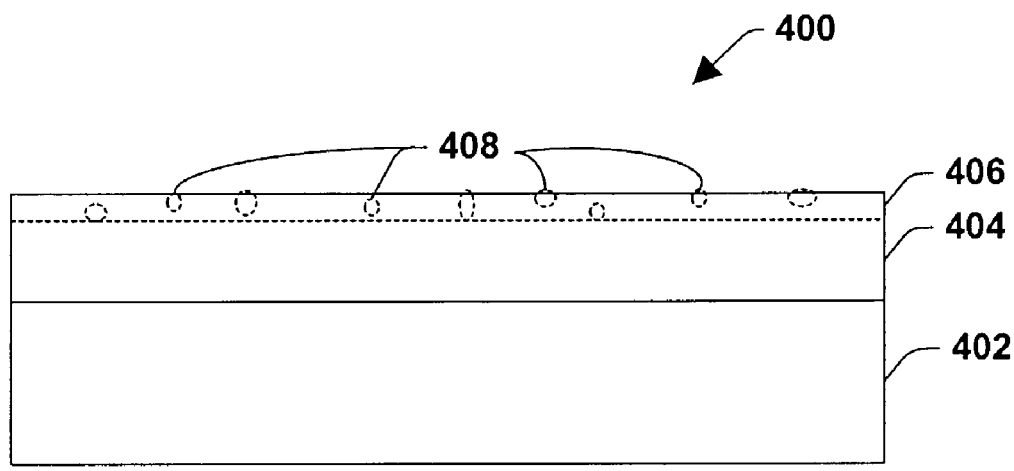
FIGS. 4–23 are cross-sectional illustrations of a transistor formed according to one or more aspects of the present invention with passivated electrically active defects.

Initially, a layer of high-k dielectric material 404 is formed across the substrate 402 (FIG. 4). The substrate 402 generally comprises silicon, while the layer of high-k dielectric material 404 can include any of a number of suitable materials that, alone or in combination, have a dielectric constant (k) greater than that of silicon dioxide ($SiO_2$) or about 3.9. Such high-k materials can include, for example, silicon nitride ($SiN_4$), tantalum pentoxide ($Ta_2O_5$), titanium oxide ($TiO_2$), barium strontium titanate (BST), which have dielectric constants of between 7 and 9, between 20 and 26, 30 and >200, respectively, as well as $Al_2O_3$, $ZrO_2$, $HfO_2$, zirconium oxynitride, hafnium oxynitride, zirconium silicate, hafnium silicate, zirconium silicon oxynitride, hafnium silicon oxynitride or other suitable materials. It is to be appreciated that the layer of high-k dielectric material 404 can be formed across the substrate 402 in any of a number of suitable manners, including, for example, with spin-on techniques, sputtering techniques (e.g., magnetron or ion beam sputtering), growth and/or deposition techniques, such as chemical vapor deposition (CVD).

Figure 5:
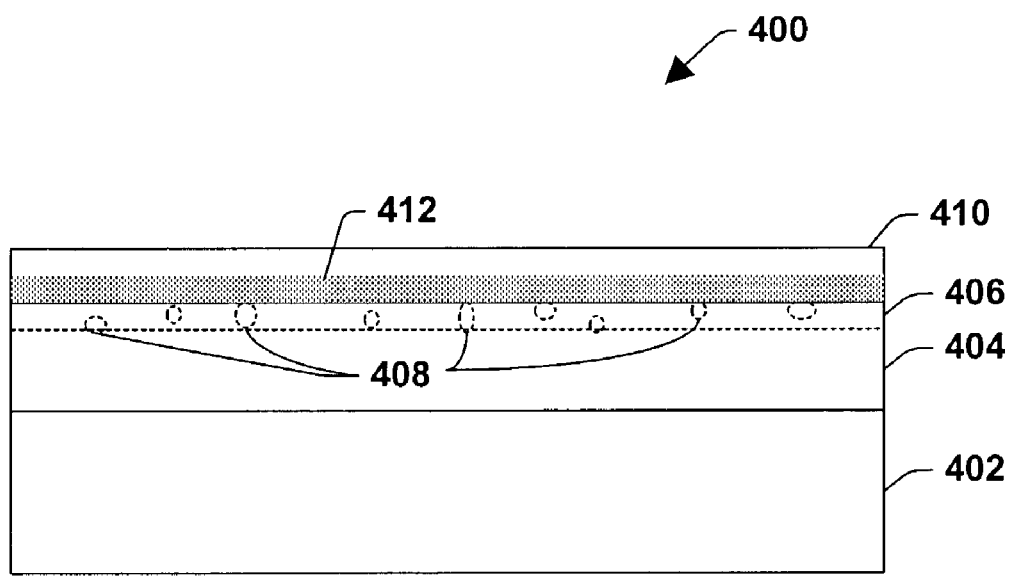

A top surface 406 (depicted in phantom) of the layer of high-k dielectric material 404 has a plurality electrically active defects 408 (also depicted in phantom) associated therewith. A layer of solid material 410 is then formed over the layer of high-k dielectric material 404 (FIG. 5). The layer of solid material 406 can be formed across the layer of high-k dielectric material 404 in any suitable manner, such as by growth, deposition and/or spin-on techniques, for example. The layer of solid material 406 can comprise, for example, at least one of phosphate silicate glass (PSG) and phosphorous (P) implanted $SiO_2$, and includes at least some type of dopant material 412 (depicted as a shading therein). The layer of solid material can also have, for example, a thickness of between about 50 to 1000 Angstroms.

Figure 6:
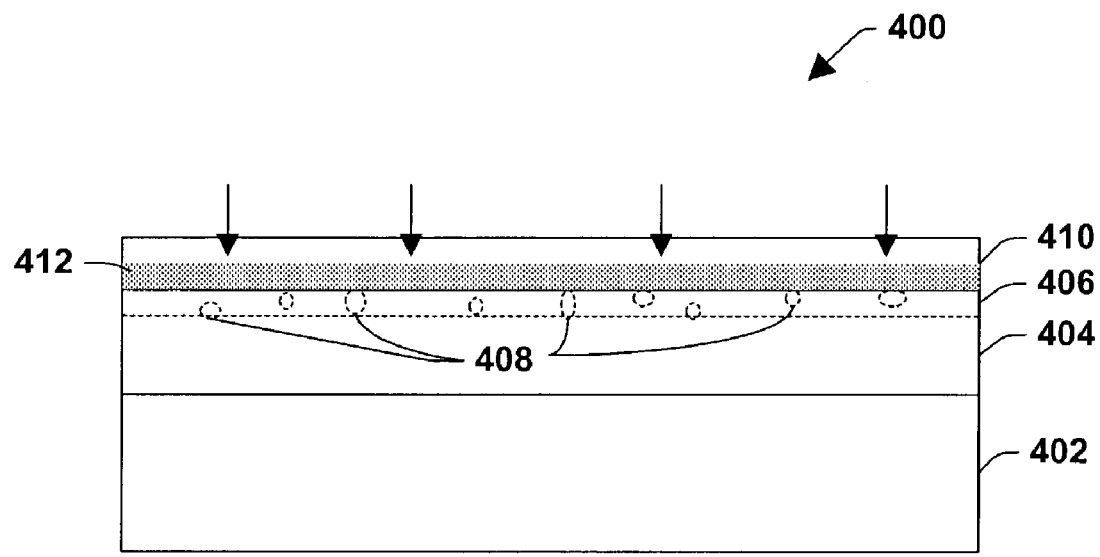

At least some of the dopant material 412 is then driven into the top surface 406 of the layer of high-k dielectric material 404 to passivate at least some of the electrically active defects 408 located within the top surface 406 of the layer of high-k dielectric material 404 (FIG. 6). The layer of solid material 410 can, for example, be heated to a temperature of about 250 to 1000 degrees C. for about 1 second to 1 hour to facilitate driving the dopant into the layer of high-k dielectric material 404. At least some of the properties of the dopant 412 cause it to be attracted to the electrically active defects 408 and to neutralize at least some of the defects 408.

According to one or more other aspects of the present invention, the layer of solid material 410 can also be comprised of at least one of boron oxide ($B_2O_3$) and $P_2O_5$, can have a thickness of between about 50 to 1000 Angstroms and can be heated to a temperature of about 250 to 650 degrees C. for about 20 to 40 minutes, for example, to drive the dopant 412 into the layer of high-k dielectric material 404 and passivate the electrically active defects 408.

According to yet another aspect of the present invention, rather than forming a layer of solid material containing one or more dopants onto the layer of high-k dielectric material 404, the electrically active defects 408 can be passivated by subjecting the layer of high-k dielectric material 404 to a gas phase treatment with annealing. The substrate and layer of high-k dielectric material can be placed into a chamber, such as a furnace, for example, and exposed to a mixture of one or more substances in gaseous form that contain one or more suitable dopants, such as phosphine $PH_3$ or arsine $AsH_3$, for example. The temperature within the chamber can then be adjusted up or down while optionally controlling the pressure within the chamber to cause the dopants from the gaseous phase to react with and neutralize the electrically active defects 408 located within the top surface 406 of the layer of high-k dielectric material 404. By-products of the reaction, such as residual solids, can then be removed from the layer of high-k dielectric material 404, such as by chemical mechanical polishing (CMP), dry etch, wet etch, or de-ionized water rinse, for example.

Figure 7:
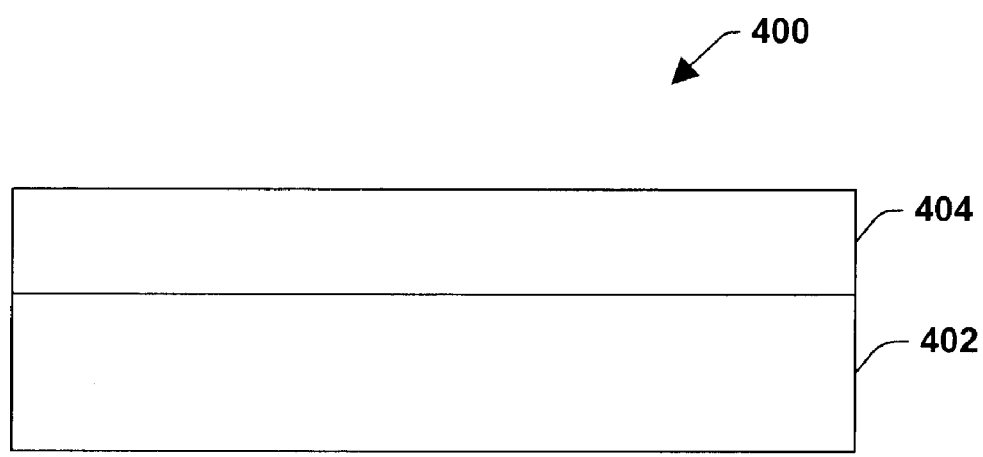
Figure 8:
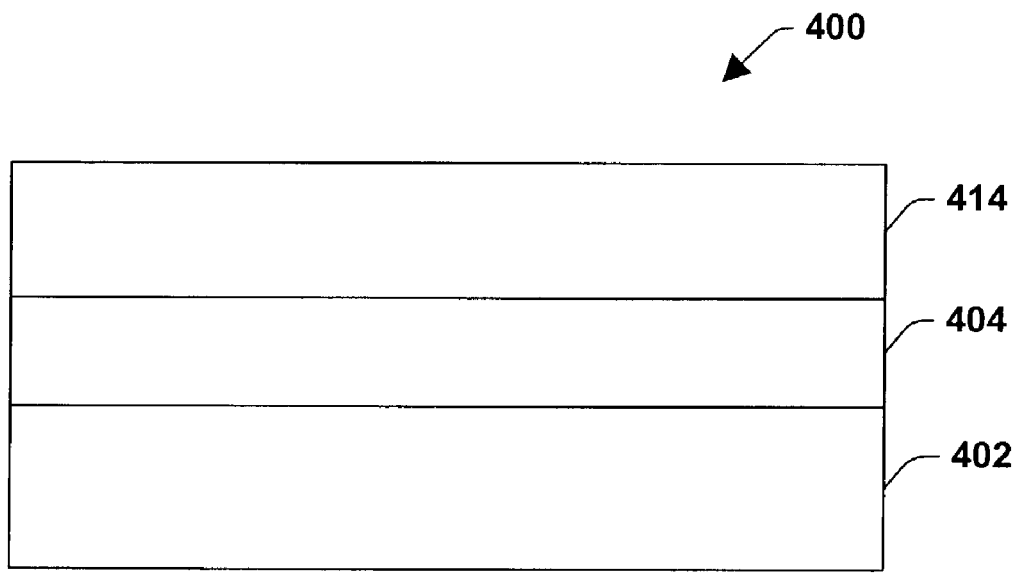
Figure 9:
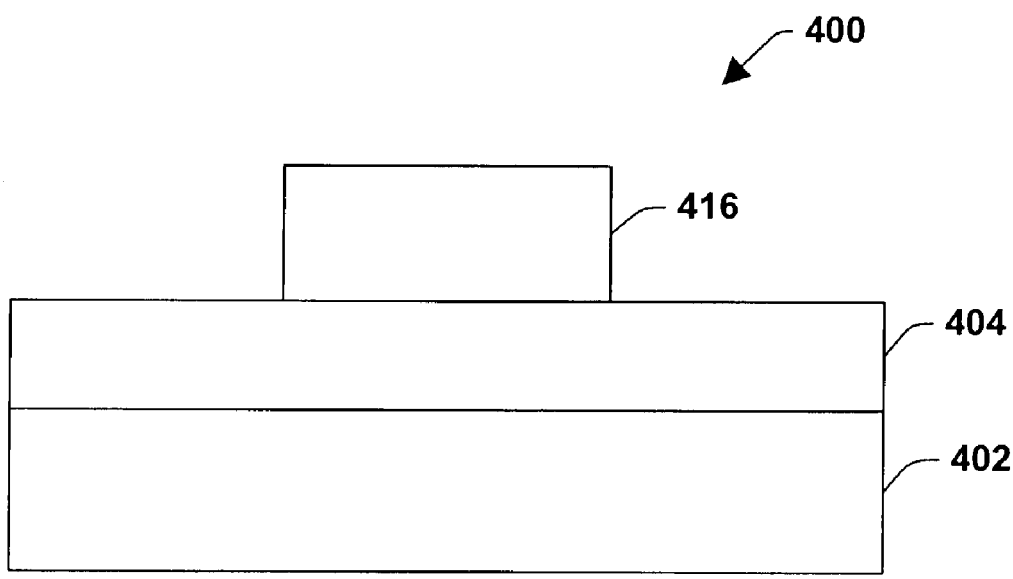
Figure 10:
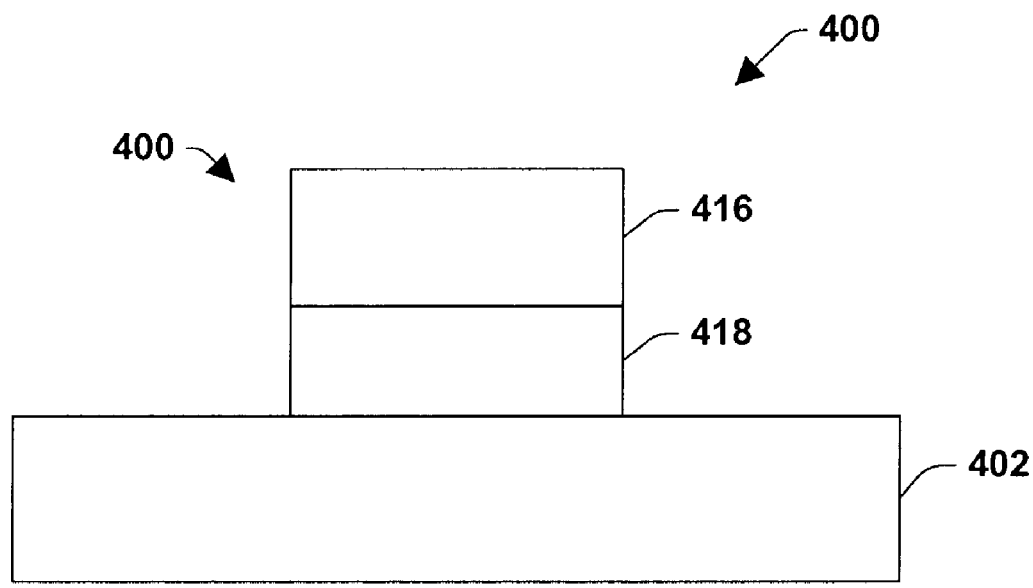

With regard to coating the layer of high-k dielectric material 404 with a layer of solid material 410, however, the layer of solid material is stripped away after being heated. The layer of solid material 410 can be removed in any suitable manner, such as by acid rinsing, for example, to expose the substantially defect free layer of high-k dielectric material 404 (FIG. 7). A gate electrode layer 414 is then formed over the layer of high-k dielectric material 404 (e.g., via spin-on, sputtering, deposition, growth techniques, etc.) (FIG. 8). The gate electrode layer 414 generally comprises polysilicon or an equivalent, and is patterned in any suitable manner, via etching, for example, to form a gate electrode structure or gate contact 416 of the transistor 400 (FIG. 9). The contact 416 provides a means for applying a voltage to the transistor 400 or otherwise biasing the transistor 400. It is to be appreciated that the substantially defect free layer of high-k dielectric material 404 can also be patterned (e.g., via etching) to produce a gate dielectric 418 between the gate electrode 416 and the substrate 402 (FIG. 10). The gate dielectric 418 and gate electrode 416 constitute a gate structure 420 within the transistor 400.

Figure 11:
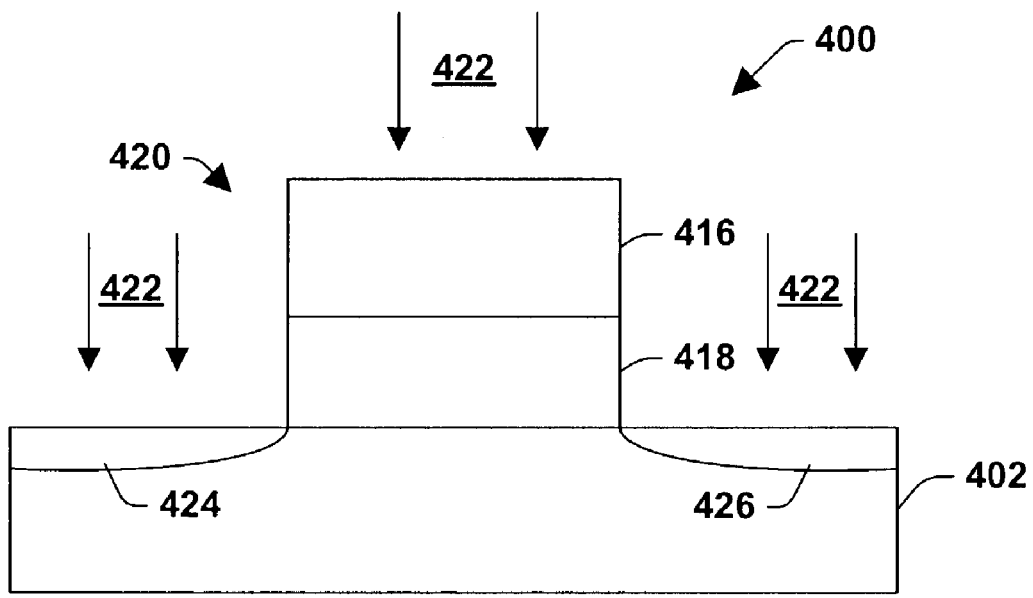

N or p type dopant 422 is then applied to the substrate 402 on either side of the gate structure 420 to form desired extension regions 424, 426, which are precursors to source and drain regions in the transistor (FIG. 11). It will be appreciated that n-type dopant is applied to form an NMOS transistor, while p-type dopant is applied to form a PMOS transistor. It will be further appreciated that the gate electrode 416 may also receive dopant 422 when the extension regions 424, 426 are created.

Figure 12:
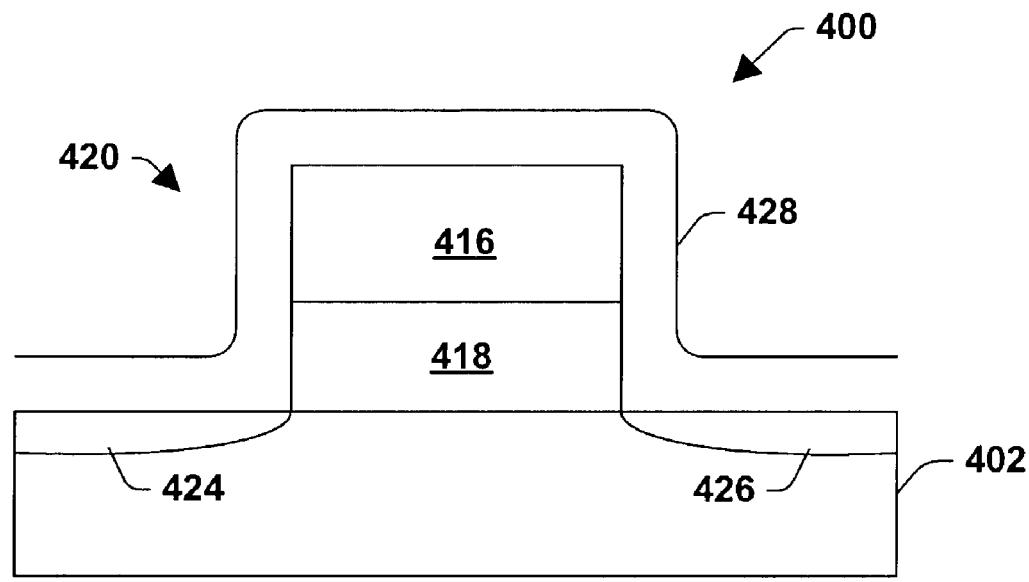
Figure 13:
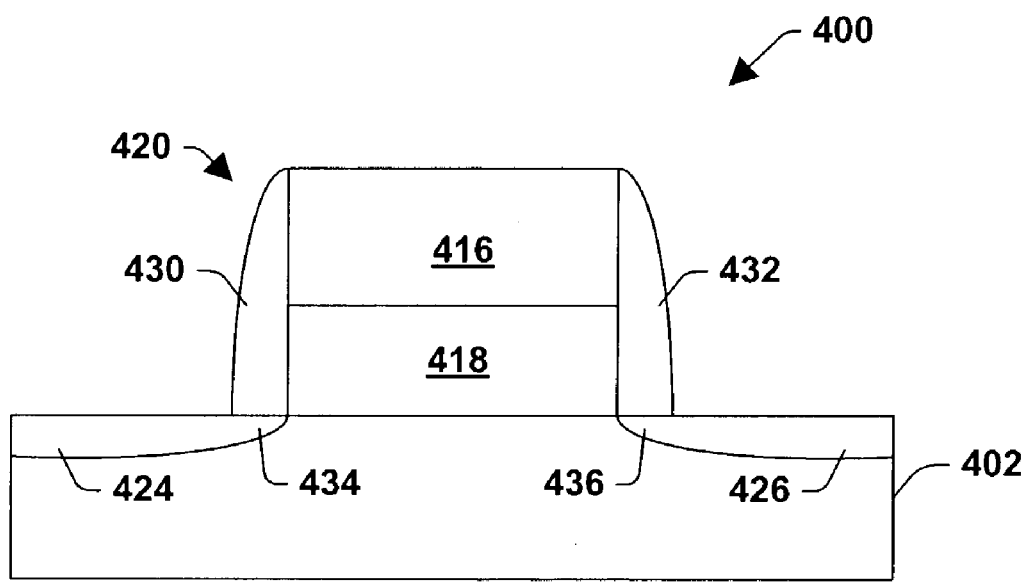
Figure 14:
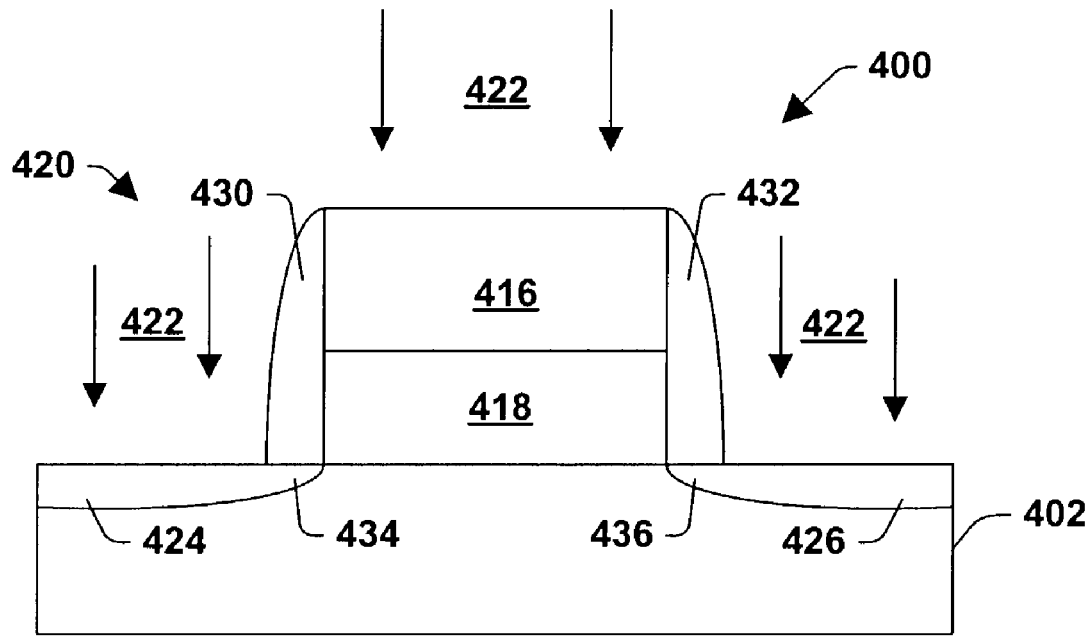
Figure 15:
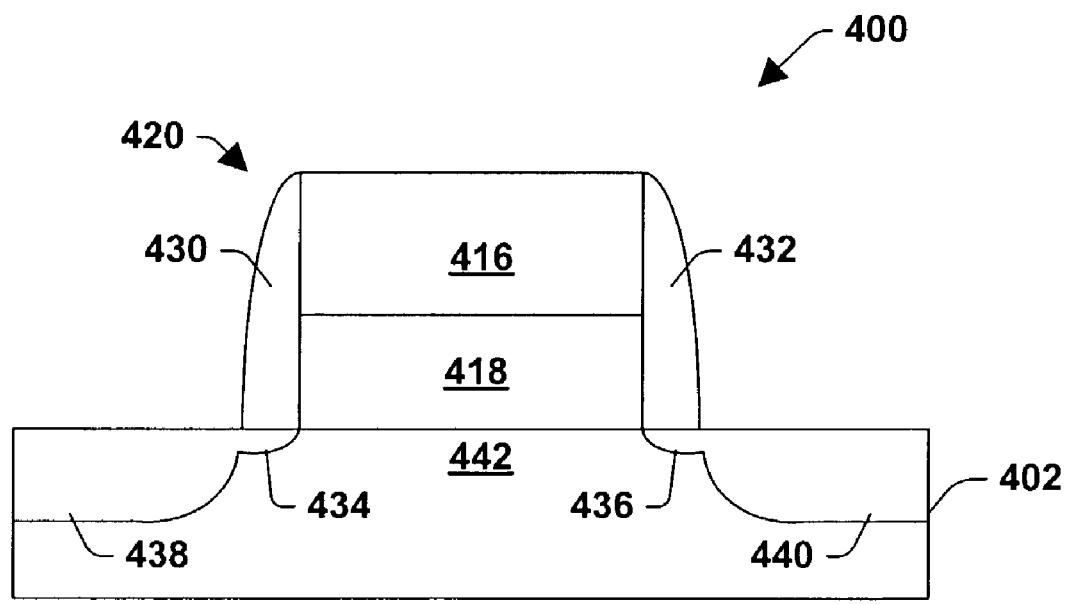

A layer of an insulating material 428 (e.g., silicon nitride, silicon oxide) is then formed over the entire structure (FIG. 12). The layer of insulating material is selectively removed (e.g., via anisotropic etching) to form sidewall spacers 430, 432 on either side of the gate structure 420 (FIG. 13). The sidewall spacers 430, 432 cover portions 434, 436 of the extension regions 424, 426 and deter subsequently applied dopant from entering these regions 434, 436. Additional n or p type dopant 422 is then applied (FIG. 14) to establish source and drain regions 438, 440 within the substrate 402 on either side of the gate structure 420 (FIG. 15). It will be appreciated that the additional dopant 422 is of substantially the same type as that previously applied in forming the extension regions 424, 426 (e.g., FIG. 11). A channel region 442 is thereby defined within the substrate 402 under the gate structure 420 as the source and drain regions 438, 440 are formed. The gate electrode 418 may also receive dopant 422 when the source and drain regions 438, 440 are formed, which doping will have minimal exposure to the adverse effects of electrically active defects present within a top surface of the high-k dielectric since such defects have been passivated.

It will be appreciated that the dopant 412 (FIGS. 5 and 6) in the donor layer of solid material 410 is likely opposite to the type of dopant 422 that is applied to create the source and drain regions 438, 440. As such, it may be said that the top portion of the high-k dielectric layer is "counter-doped" when the source and drain regions are created. By way of example, in creating an NMOS transistor, the layer of solid material 410 likely includes a p-type dopant (e.g., boron). As such, when the source and drain regions are created the transistor 400 is "counter-doped" with a n-type dopant 422.

Figure 16:
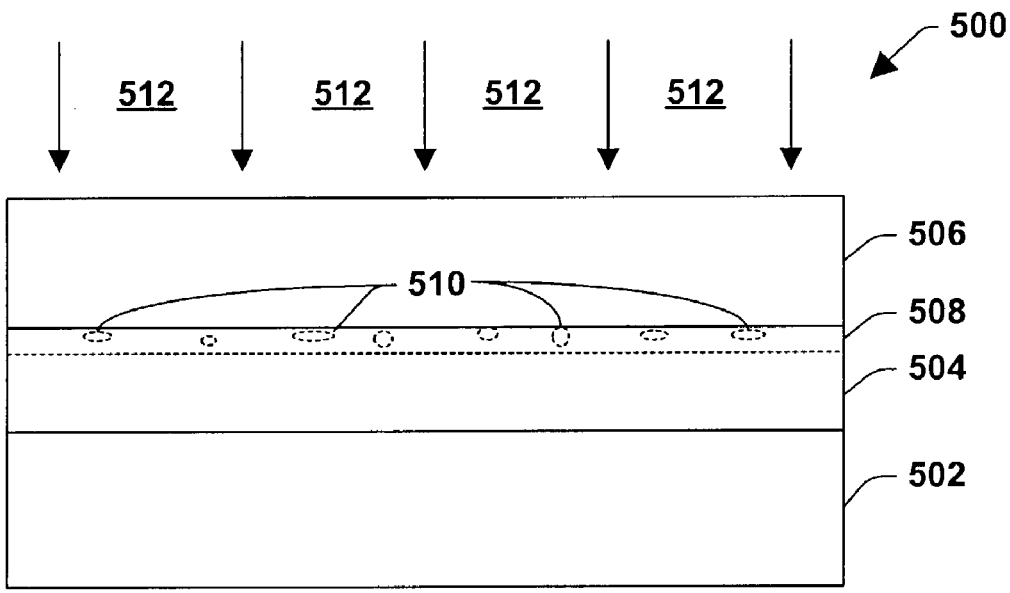

Turning to FIGS. 16–23 in accordance with still another aspect of the present invention, electrically active defects can be passivated after a gate electrode layer has been formed across a layer of high-k dielectric material. By way of example, FIG. 16 illustrates a cross-sectional view of the makings of a transistor 500 formed upon a substrate 502 where a layer of high-k dielectric material 504 is formed across the substrate 502 and a gate electrode layer 506 (e.g., polysilicon) is formed across the layer of high-k dielectric material 504. A top portion 508 (depicted in phantom) of the layer of high-k dielectric material 504 comprises a plurality of electrically active defects 510. A dopant 512 can be implanted into the gate electrode layer 506 and annealed to diffuse therethrough and passivate the electrically active defects 510.

Figure 17:
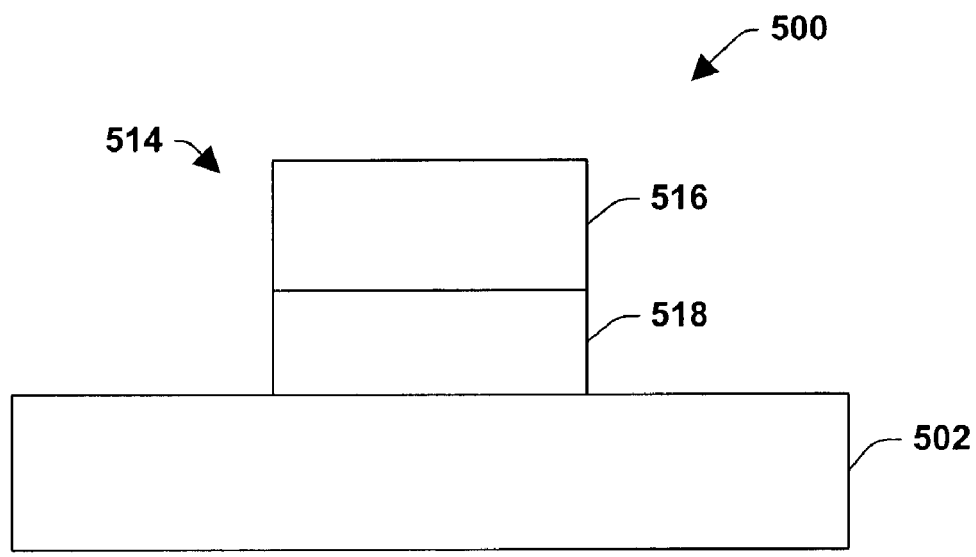
Figure 18:
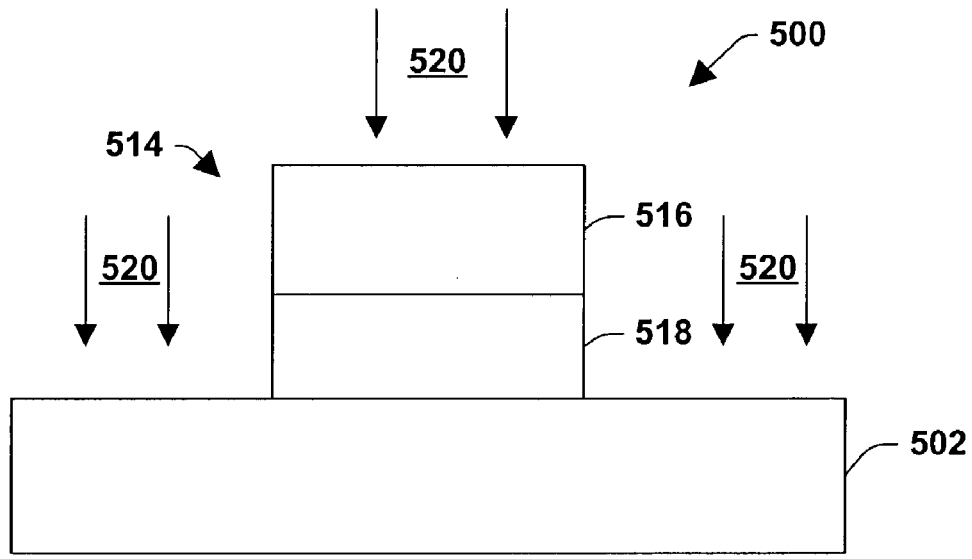
Figure 19:
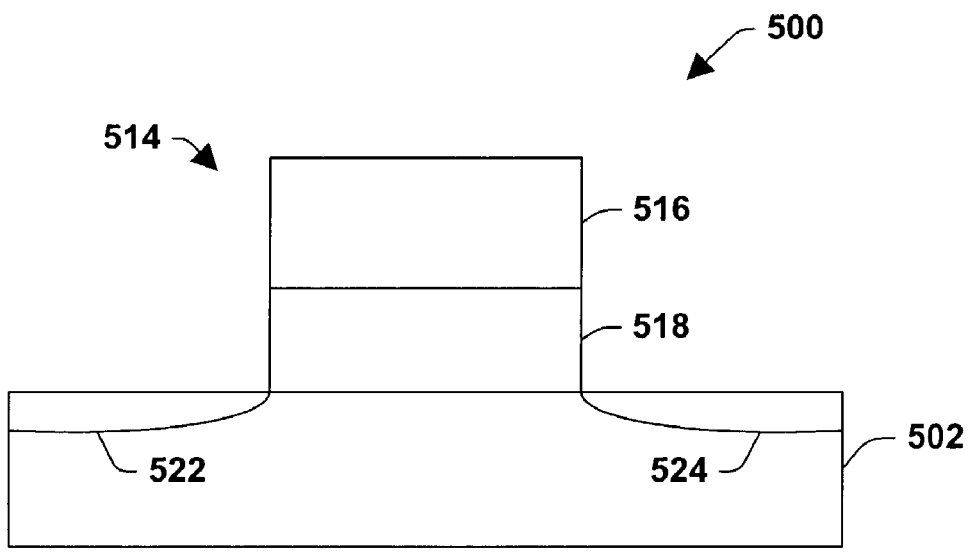

The gate electrode layer 506 and the now neutralized layer of high-k dielectric material 504 can then be patterned (e.g., via etching) to establish a gate structure 514 upon the substrate 504 (FIG. 17). The gate structure 514 includes a gate electrode 516 and a gate dielectric 518 that electrically insulates the gate electrode 516 from the substrate 502. The transistor can then be lightly "counter-doped" with n or p type dopant 520 (FIG. 18) to form extension regions 522, 524 within the substrate 502 on opposite sides of the gate structure 514 (FIG. 19). It will be appreciated that the gate electrode 516 can also receive some of the dopant 520 during this doping process.

Figure 20:
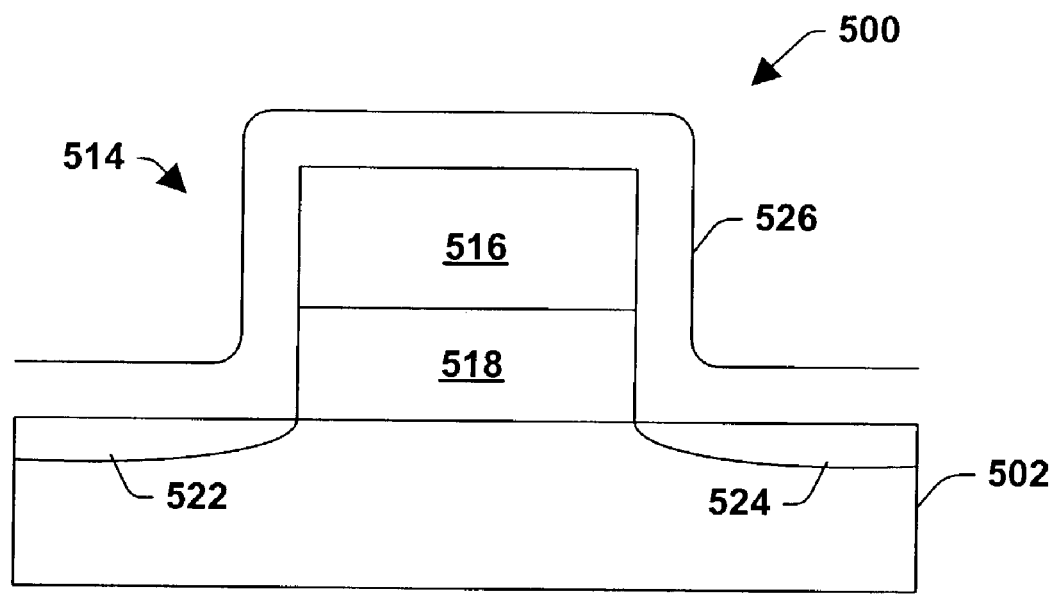
Figure 21:
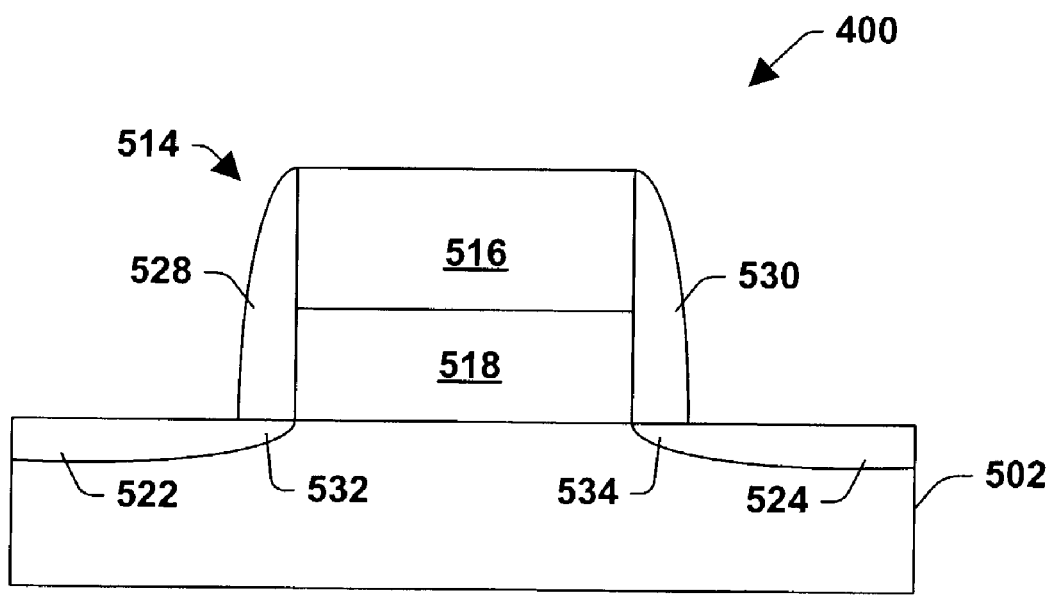
Figure 22:
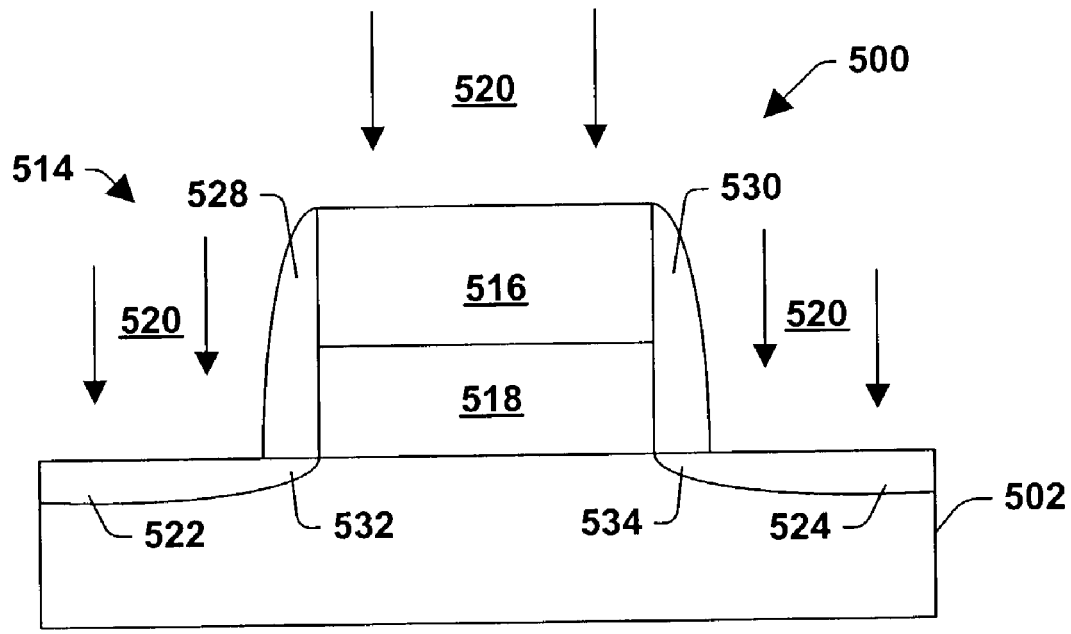
Figure 23:
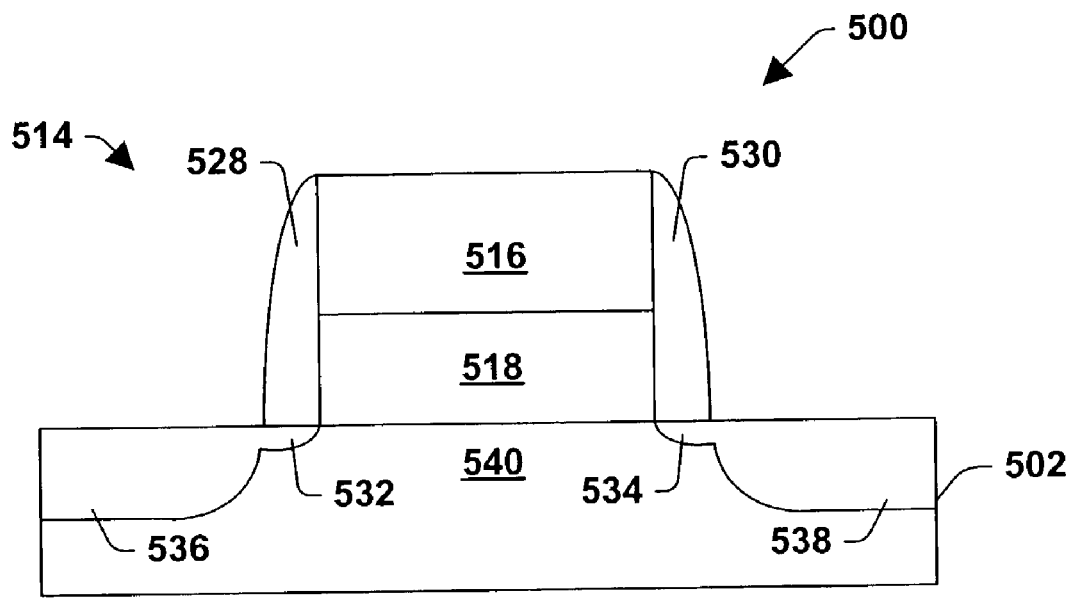

A layer of an insulating material 526 (e.g., silicon nitride, silicon oxide) can then be formed over the entire structure (FIG. 20). The layer of insulating material is selectively removed (e.g., via anisotropic etching) to form sidewall spacers 528, 530 on either side of the gate structure 514 (FIG. 21). The sidewall spacers 528, 530 cover portions 532, 534 of the extension regions 522, 524 and deter subsequently applied dopant from entering these regions 532, 534. Additional n or p type dopant 520 is then applied (FIG. 22) to establish source and drain regions 536, 538 within the substrate 502 on either side of the gate structure 514 (FIG. 23). It will be appreciated that the additional dopant 520 (FIG. 22) is of substantially the same type as that previously applied in forming the extension regions 522, 524 (e.g., FIGS. 18, 19). Additionally, a channel region 540 is defined within the substrate 502 under the gate structure 514 as the source and drain regions 536, 538 are formed (FIG. 23). The gate electrode 516 may also receive dopant 520 when the source and drain regions 536, 538 are formed, which doping will have minimal exposure to the adverse effects of electrically active defects present within a top surface of the high-k dielectric since such defects have been passivated.

Therefore, if an NMOS transistor is being fabricated, the polysilicon layer 506 can be doped prior to patterning with a p-type dopant, wherein the p-type dopant diffuses down to the poly/high-k interface and passivates electrically active defects 510 associated thereat (region 508, FIG. 16). Then, after patterning the polysilicon, an n-type implant is performed which forms the n-type source/drain regions while concurrently counterdoping the poly gate 516. Furthermore, n-type dopant from the poly gate 516 may combine with the p-type dopant at region 508 to render that region generally neutral thereat, and thus mitigate any potential impact.

Accordingly, one may now appreciate that one or more aspects of the present invention provide a methodology for passivating electrically active defects at the interface of a gate electrode and gate dielectric layer. Readily available materials are utilized in the process and no additional masks are required such that the process is thus cost effective and efficient. Electrically active defects at the interface can severely degrade the channel mobility of transistor devices either by trapping and releasing electrons, or by providing a charged site that would apply a force normal to current flow. Either of these effects will inhibit current flow and subsequently reduce the channel mobility as well as severely degrade $V_{fb}$ and Vt performance. Passivating makes the surface of the gate dielectric less reactive with the polysilicon gate and neutralizes the reactivity of that surface with the polysilicon. Consequently, resulting semiconductor devices are more reliable, are more uniform with regard to their performance characteristics and can be produced with a higher effective yield.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a transistor comprising:
   forming a high-k dielectric layer over a semiconductor substrate, the high-k dielectric layer having a top surface associated therewith;
   passivating electrically active defects associated with the top surface of the high-k dielectric layer;
   forming a gate electrode layer over the high-k dielectric layer;
   patterning the gate electrode layer to form a gate electrode structure; and
   forming source and drain regions in the semiconductor substrate on opposite sides of the gate electrode structure, and defining a channel region therebetween;
   wherein passivating the electrically active defects comprises:
      forming a donor layer having a dopant associated therewith over the high-k dielectric layer; and
      driving the dopant from the donor layer into the high-k dielectric layer, wherein the dopant neutralizes at least some of the electrically active defects.

2. The method claim 1, wherein driving the dopant into the high-k layer comprises:
   heating the donor layer to a temperature of about 250 to 1000 degrees C for about 1 second to 1 hour.

3. The method of claim 2, wherein the donor layer comprises at least one of phospho-silicate glass (PSG), borosilicate glass (BSG), borophosphosilicate glass (BPSG), phosphorous (P) implanted $SiO_2$, boron (B) implanted into $SiO_2$, boric oxide ($B_2O_3$) and phosphoric oxide ($P_2O_5$).

4. The method of claim 1, wherein the donor layer comprises a thickness of between about 50 to 1000 Angstroms.

5. The method of claim 1, further comprising:
   removing the donor layer after passivating the electrically active defects.

6. A method of forming a transistor comprising:
   forming a high-k dielectric layer over a semiconductor substrate, the high-k dielectric layer having a top surface associated therewith;
   passivating electrically active defects associated with the top surface of the high-k dielectric layer;
   forming a gate electrode layer over the high-k dielectric layer;
   patterning the gate electrode layer to form a gate electrode structure; and
   forming source and drain regions in the semiconductor substrate on opposite sides of the gate electrode structure, and defining a channel region therebetween;
   wherein passivating the electrically active defects comprises:
      exposing the top surface of the high-k dielectric layer to gaseous forms of a p-type or n-type dopant; and
      annealing the high-k dielectric layer such that at least some of the dopant gas is attracted to and neutralizes at least some of the electrically active defects.

7. The method of claim 6, wherein the dopant gas comprises at least one of phosphine ($PH_3$) and arsine ($AsH_3$).

8. A method of forming a transistor comprising:
   forming a high-k dielectric layer over a semiconductor substrate, the high-k dielectric layer having a top surface associated therewith;
   passivating electrically active defects associated with the top surface of the high-k dielectric layer;
   forming a gate electrode layer over the high-k dielectric layer;
   patterning the gate electrode layer to form a gate electrode structure; and
   forming source and drain regions in the semiconductor substrate on opposite sides of the gate electrode structure, and defining a channel region therebetween;
   wherein the gate electrode layer is formed over the high-k dielectric layer prior to passivating the electrically active defects, the method comprising:
      doping the gate electrode layer; and
      annealing the gate electrode layer such that at least some of the dopant is attracted to at least some of the electrically active defects to neutralize at least some of the electrically active defects, wherein doping the gate electrode comprises doping the gate electrode with a p-type dopant for an NMOS transistor or an n-type dopant for a PMOS transistor before patterning the gate electrode, and wherein forming the source and drain regions comprises doping the substrate and the gate electrode after a patterning thereof with an n-type dopant for the NMOS transistor or a p-type dopant for the PMOS transistor.

9. A method of fabricating a PMOS device, comprising:
   heating a solid material having an n-type dopant associated therewith formed over a layer of high-k dielectric material to about 250 to 1000 degrees C for about 1 second to 1 hour to drive at least some of the n-type dopant from the solid material into at least some of the high-k dielectric material to neutralize at least some electrically active defects within the high-k dielectric material;
   removing the solid material to expose the high-k dielectric material;
   forming a gate electrode layer over the high-k dielectric material;

patterning the gate electrode layer; and doping a source region, a drain region and the patterned gate electrode layer with a p-type dopant.

10. The method of claim 9, wherein the solid material comprises at least one of phosphate silicate glass (PSG), phosphorous (P) implanted $SiO_2$, phosphoric oxide ($P_2O_5$) and borophosphosilicate glass (BPSG).

11. The method of claim 9, wherein the solid material comprises a thickness between about 50 to 1000 Angstroms.

12. The method of claim 9, wherein the gate electrode layer comprises polysilicon, polysilicon germanium or metal.

13. A method of fabricating an NMOS device, comprising:

heating a solid material having an p-type dopant associated therewith formed over a layer of high-k dielectric material to about 250 to 1000 degrees C for about 1 second to 1 hour to drive at least some of the p-type dopant from the solid material into at least some of the high-k dielectric material to neutralize at least some electrically active defects within the high-k dielectric material;

removing the solid material to expose the high-k dielectric material;

forming a gate electrode layer over the high-k dielectric material;

patterning the gate electrode layer; and doping a source region, a drain region and the patterned gate electrode layer with an n-type dopant.

14. The method of claim 13, wherein the p-type dopant comprises boron.

15. The method of claim 13, wherein the gate electrode layer comprises polysilicon, polysilicon germanium or metal.

* * * * *